US008710839B2

(12) United States Patent
Constable et al.

(10) Patent No.: US 8,710,839 B2
(45) Date of Patent: Apr. 29, 2014

(54) O-SPACE IMAGING: HIGHLY EFFICIENT PARALLEL IMAGING USING COMPLEMENTARY NONLINEAR ENCODING GRADIENT FIELDS AND RECEIVE COIL GEOMETRIES

(75) Inventors: Robert Todd Constable, Madison, CT (US); Jason Stockmann, New Haven, CT (US); Lick-Kong Tam, New Haven, CT (US)

(73) Assignee: Yale University, New Haven, CT (US)

( * ) Notice: Subject to any disclaimer, the term of this patent is extended or adjusted under 35 U.S.C. 154(b) by 183 days.

(21) Appl. No.: 12/998,877

(22) PCT Filed: Dec. 14, 2009

(86) PCT No.: PCT/US2009/006544
§ 371 (c)(1),
(2), (4) Date: Jun. 9, 2011

(87) PCT Pub. No.: WO2010/068299
PCT Pub. Date: Jun. 17, 2010

(65) Prior Publication Data
US 2011/0241675 A1    Oct. 6, 2011

Related U.S. Application Data

(60) Provisional application No. 61/121,927, filed on Dec. 12, 2008.

(51) Int. Cl.
*G01R 33/3415* (2006.01)
(52) U.S. Cl.
USPC .......................................... 324/309; 324/307
(58) Field of Classification Search
USPC .................. 324/300–322; 382/128–131; 600/407–435
See application file for complete search history.

(56) References Cited

U.S. PATENT DOCUMENTS

| 5,132,621 | A | * | 7/1992 | Kang et al. | 324/322 |
| 5,610,521 | A | * | 3/1997 | Zou et al. | 324/318 |
| 5,939,883 | A | * | 8/1999 | Green et al. | 324/322 |
| 5,998,999 | A | * | 12/1999 | Richard et al. | 324/318 |
| 6,029,081 | A | * | 2/2000 | DeMeester et al. | 600/410 |
| 6,029,082 | A | * | 2/2000 | Srinivasan et al. | 600/422 |
| 6,229,310 | B1 | * | 5/2001 | Green et al. | 324/318 |
| 6,316,941 | B1 | * | 11/2001 | Fujita et al. | 324/318 |
| 6,396,271 | B1 | * | 5/2002 | Burl et al. | 324/318 |
| 6,624,633 | B1 | * | 9/2003 | Zou et al. | 324/318 |
| 6,636,040 | B1 | * | 10/2003 | Eydelman | 324/318 |
| 6,876,199 | B2 | * | 4/2005 | Hardy et al. | 324/309 |

(Continued)

*Primary Examiner* — Melissa Koval
*Assistant Examiner* — Tiffany Fetzner
(74) *Attorney, Agent, or Firm* — Lumen Patent Firm

(57) ABSTRACT

In MRI by excitation of nuclear spins and measurement of RF signals induced by these spins in the presence of spatially-varying encoding magnetic fields, signal localization is performed through recombination of measurements obtained in parallel by each coil in an encircling array of RF receiver coils. Through the use of magnetic gradient fields that vary both as first-order and second-order Z2 spherical harmonics with position, radially-symmetric magnetic encoding fields are created that are complementary to the spatial variation of the encircling receiver coils. The resultant hybrid encoding functions comprised of spatially-varying coil profiles and gradient fields permits unambiguous localization of signal contributed by spins. Using hybrid encoding functions in which the gradient shapes are thusly tailored to the encircling array of coil profiles, images are acquired in less time than is achievable from a conventional acquisition employing only first-order gradient fields with an encircling coil array.

11 Claims, 9 Drawing Sheets

(56) References Cited

U.S. PATENT DOCUMENTS

| | | | |
|---|---|---|---|
| 7,084,629 B2* | 8/2006 | Monski et al. | 324/318 |
| 7,123,008 B1* | 10/2006 | Damadian et al. | 324/309 |
| 7,176,688 B2* | 2/2007 | Sato | 324/318 |
| 7,375,521 B1* | 5/2008 | Damadian et al. | 324/307 |
| 7,391,213 B2* | 6/2008 | Watkins et al. | 324/318 |
| 7,495,443 B2* | 2/2009 | Leussler et al. | 324/318 |
| 7,573,432 B1* | 8/2009 | Eydelman et al. | 343/792 |
| 7,747,310 B2* | 6/2010 | Misic et al. | 600/423 |
| 7,750,630 B2* | 7/2010 | Van Helvoort et al. | 324/307 |
| 7,800,368 B2* | 9/2010 | Vaughan et al. | 324/318 |
| 7,885,704 B2* | 2/2011 | Misic | 600/423 |
| 7,911,209 B2* | 3/2011 | Alradady et al. | 324/318 |
| 8,111,067 B1* | 2/2012 | Damadian et al. | 324/307 |
| 8,193,812 B2* | 6/2012 | Pinkerton et al. | 324/318 |
| 8,198,892 B2* | 6/2012 | Doyle | 324/309 |
| 8,244,017 B2* | 8/2012 | Chun et al. | 382/131 |
| 2002/0101241 A1* | 8/2002 | Chui | 324/319 |
| 2004/0220468 A1* | 11/2004 | Watkins et al. | 600/410 |
| 2004/0236209 A1* | 11/2004 | Misic et al. | 600/423 |
| 2004/0239324 A1* | 12/2004 | Hardy et al. | 324/309 |
| 2005/0099179 A1* | 5/2005 | Monski et al. | 324/318 |
| 2008/0129292 A1* | 6/2008 | Leussler et al. | 324/318 |
| 2008/0129298 A1* | 6/2008 | Vaughan et al. | 324/322 |
| 2008/0275332 A1* | 11/2008 | Alradady et al. | 600/422 |
| 2009/0076378 A1* | 3/2009 | Misic | 600/423 |
| 2009/0079432 A1* | 3/2009 | Pinkerton et al. | 324/322 |
| 2009/0237079 A1* | 9/2009 | Van Helvoort et al. | 324/313 |
| 2010/0142823 A1* | 6/2010 | Wang et al. | 382/195 |
| 2010/0256480 A1* | 10/2010 | Bottomley et al. | 600/411 |
| 2010/0271020 A1* | 10/2010 | Doyle | 324/309 |
| 2011/0125005 A1* | 5/2011 | Misic | 600/423 |
| 2011/0163751 A1* | 7/2011 | Pinkerton et al. | 324/322 |
| 2011/0241675 A1* | 10/2011 | Constable et al. | 324/309 |
| 2011/0241683 A1* | 10/2011 | Nnewihe et al. | 324/318 |
| 2012/0062230 A1* | 3/2012 | Vaughan et al. | 324/318 |
| 2012/0068704 A1* | 3/2012 | Popescu | 324/309 |
| 2012/0223709 A1* | 9/2012 | Schillak et al. | 324/309 |

* cited by examiner

O-Space vs. SENSE encoding for increasing acceleration factors (R)

O-SPACE IMAGING: HIGHLY EFFICIENT PARALLEL IMAGING USING COMPLEMENTARY NONLINEAR ENCODING GRADIENT FIELDS AND RECEIVE COIL GEOMETRIES

CROSS-REFERENCE TO RELATED APPLICATIONS

This application is a 371 of PCT Patent Application PCT/US2009/006544 filed Dec. 14, 2009, which claims the benefit of US Provisional Application 61/121927 filed Dec. 12, 2008.

FIELD OF THE INVENTION

The invention relates generally to parellel imaging methods and systems. In particular, the invention related to methods and systems incorporating highly efficient parallel imaging using second-order nonlinear fields as encoding gradients with no phase encoding.

BACKGROUND OF THE INVENTION

Parallel imaging methods exploit the spatial encoding contained in independent RF coil profiles to perform image reconstruction from undersampled k-space data (1). Aliasing artifacts are removed using the spatial information of the coil profiles to fill in missing phase encode lines either in the image domain, as in SENSE (2), or in k-space, as in GRAPPA (3). Parallel imaging performance is evaluated based on the geometry factor, or g-factor, which maps the amount of noise amplification that occurs in each voxel as a result of the image reconstruction problem being underdetermined by linear dependence between the coil profiles (2,4). Extensive efforts have been invested into optimizing coil profile orthogonality for a given ROI (5) and into exploring parallel imaging with undersampled non-Cartesian k-space trajectories (6). But to date, scan acceleration has only been performed with data collected using linear gradient fields applied along X, Y, and Z. For the case of circumferentially distributed surface coils, we propose in this invention that a radially-symmetric gradient shape would be a better complement to the coil array than a linearly-varying gradient, thereby reducing the amount of data that must be acquired for imaging at a given resolution.

Gradient fields and RF coil profiles are based on fundamentally different physics and do not interfere with one another. Therefore they can be freely combined to form encoding functions that are optimized for parallel imaging (7). Linear imaging gradients create plane-wave encoding functions weighted by the coil sensitivity profile. Because these plane waves comprise the kernel of the Fourier Transform integral, linear gradients provide fast and straightforward image reconstruction via the FFT once k-space is fully populated (assuming Cartesian sampling). However, for practical applications of parallel imaging, linear gradients are not generally shaped so as to take maximum advantage of the spatial encoding inherent to surface coil profiles. Because of this, large numbers of independent coils are typically required to achieve a low g-factor at high acceleration factors (8). At exceptionally high acceleration factors such as R=6 or R=4×4, moving from 32 to 96 coils substantially lowers the g-factor, albeit at the expense of greatly increased hardware cost and complexity (9). However, at more practical reduction factors such as R=3, R=4, or even R=3×3, moving from 12 to 32 coils provides much more g-factor reduction than moving from 32 to 96 coils (9). As coil elements grow smaller and more numerous, mutual coupling is greatly compounded and the coil Q-ratio generally decreases. Also, while large arrays do offer signal-to-noise ratio improvements over volume coils, as the array size grows these gains are relegated to an ever-thinner band at periphery of the sample (10).

An alternative way to improve parallel imaging performance is by imaging at ultra-high field strengths such as 7T, where wave effects within the body dielectric cause a focusing of coil profiles, improving spatial localization and the ultimate achievable g-factor for a given acceleration factor (11). However, human imaging at 7T presently entails prohibitive costs and technical complexity arising from magnet design, B1 transmit inhomogeneity, RF specific absorption rate (SAR), and other challenges (12). Furthermore, such scanners are not yet widely available, especially in clinical settings.

Recently, non-bijective curvilinear gradients have been proposed as a way to achieve faster gradient switching and spatially-varying resolution that may be tailored to objects in the ROI. In Hennig et al (13,14), two multipolar fields are generated from the real and imaginary parts of the conformal mapping. Because this mapping preserves the local angle between the isocontours of the inputs x and y, the field shapes u and v are everywhere orthogonal ($\nabla B_1 \cdot \nabla B_2=0$) and may be used as frequency and phase encoding gradients, respectively. Since $z^n$ is analytic and satisfies Laplace's equation for all n, the shapes u and v are realizable in a physical gradient coil design. The resulting fields for a given n vary in polarity with angular location and grow as $r^n$, where r is the distance from the center. An array of surface coils provides spatial information to resolve the remaining angular ambiguity. The reduced $B_0$ excursion over the bore of the scanner may permit faster gradient switching times for the same $dB_0/dt$ as compared with linear gradients, potentially allowing for faster imaging without violating safety limits for peripheral nerve stimulation. However, the relatively flat frequency isocontours at the center of the FOV result in pronounced blurring in this region.

SUMMARY OF THE INVENTION

Recent improvements in parallel imaging have been driven by the use of greater numbers of independent surface coils placed so as to minimize aliasing along the phase encode direction. However the gains from increasing the number of coils diminish as coil coupling problems begin to dominate and the ratio of acceleration gain to expense for multiple receiver chains becomes prohibitive. In this invention, we redesigned the spatial encoding strategy used in order to gain efficiency, achieving a gradient encoding scheme that is complementary to the spatial encoding provided by the receiver coils. This approach leads to "O-Space" imaging, wherein the spatial encoding gradient shapes are tailored to an existing surface coil array, making more efficient use of the spatial information contained in the coil profiles. In its simplest form, for each acquired echo the Z2 spherical harmonic is used to project the object onto sets of concentric rings, while the X and Y gradients are used to offset this projection within the imaging plane. This invention is presented, algorithms are introduced for image reconstruction, and the results reveal that O-Space encoding achieves high efficiency compared to Cartesian parallel imaging, suggesting that O-Space imaging holds great potential for highly accelerated scanning.

In summary, the invention provides the combination of one or more of the following aspects:

1. The concept of designing gradient spatial encoding schemes complementary to the spatial encoding provided by the receiver coil arrays.

2. Projection imaging based on acquisitions in the presence of x, y, z2 gradients used for readout.
3. The use of nonlinear gradients for highly accelerated parallel imaging.
4. Varying gradient amplitudes to change location of isofrequency contours.
5. Using combinations of linear and nonlinear gradients to move the center of the isofrequency contours through space.
6. Selecting center placement strategies such that regions with a flat gradient in one acquisition will have a steep gradient in another acquisition (different center placements).
7. Using the combination of x, y, z2 gradients as both dephase/rephase gradients.
8. Using the combination of x, y, z2 gradients in an echo imaging sequence including gradient echo, spin echo and stimulated echo imaging sequences.
9. The 2 dimensional nature of the Z2 gradient produces frequency encoding in 2 dimensions during the readout allowing for higher acceleration factors.
10. Performing projection imaging in any plane (axial, sagital, coronal, oblique) using combinations of x, y, z and z2.

DETAILED DESCRIPTION

In the O-Space approach of this invention, parallel imaging performance is optimized using linear combinations of multiple spherical harmonics to form gradient shapes tailored to the spatial information contained in the coil profiles (15). In principle, arbitrary gradient shapes can be chosen for each successive echo to obtain different projections of the object. In its most general form, one begins with an array of surface coil profiles, assesses their spatial encoding ability, and then designs a nonlinear gradient encoding scheme that is maximally complementary to the coil array. In a typical circumferential coil array, the profiles vary smoothly throughout the FOV, but the regions of peak sensitivity are relatively localized in angular regions near each coil. A circumferential array therefore provides more encoding in the angular direction than in the radial direction, a fact that has not been exploited by gradient encoding schemes in the past.

According to an embodiment of the invention, we used a combination of the Z2 spherical harmonic and the X and Y linear gradients to image the axial plane. This choice of gradients is motivated by two factors:
(1) The ability of the Z2 gradient to provide excellent spatial encoding along the radial direction, where circumferential coil arrays provide the least encoding; and
(2) The ready availability of coil designs for producing the Z2 spherical harmonic (16).

In this approach, conventional phase encoding is discarded and replaced by projection acquisitions with the center of the Z2 function shifted off-center using the X and Y gradients. With each acquired echo, the object is projected onto a set of frequency isocontour rings that are concentric about a different center placement (CP) in the FOV, suggesting the term "O-Space imaging." By shifting the Z2 quadratic shape off-center, it is ensured that there are enough overlapping isocontours from different projections at the center of the FOV to resolve features in this region.

The Fourier transform of an echo obtained in the presence of a radially-symmetric gradient yields a projection of the object onto a set of rings centered on the applied readout gradient. With radial localization provided by the gradients, the surface coils are ideally positioned to provide spatial localization in the angular direction. Furthermore, as will be shown in the results section, since the readout gradient provides spatial encoding in two dimensions, rather than just one as in Cartesian trajectories, additional encoding is provided by increasing the gradient strength and sampling the echo more densely with essentially no impact on the imaging time. In Cartesian parallel imaging, densely sampling the echo increases resolution in the x-direction but does not reduce the amount of aliasing in the phase encode direction. This is the primary impediment to achieving high acceleration factors.

Figure 1:
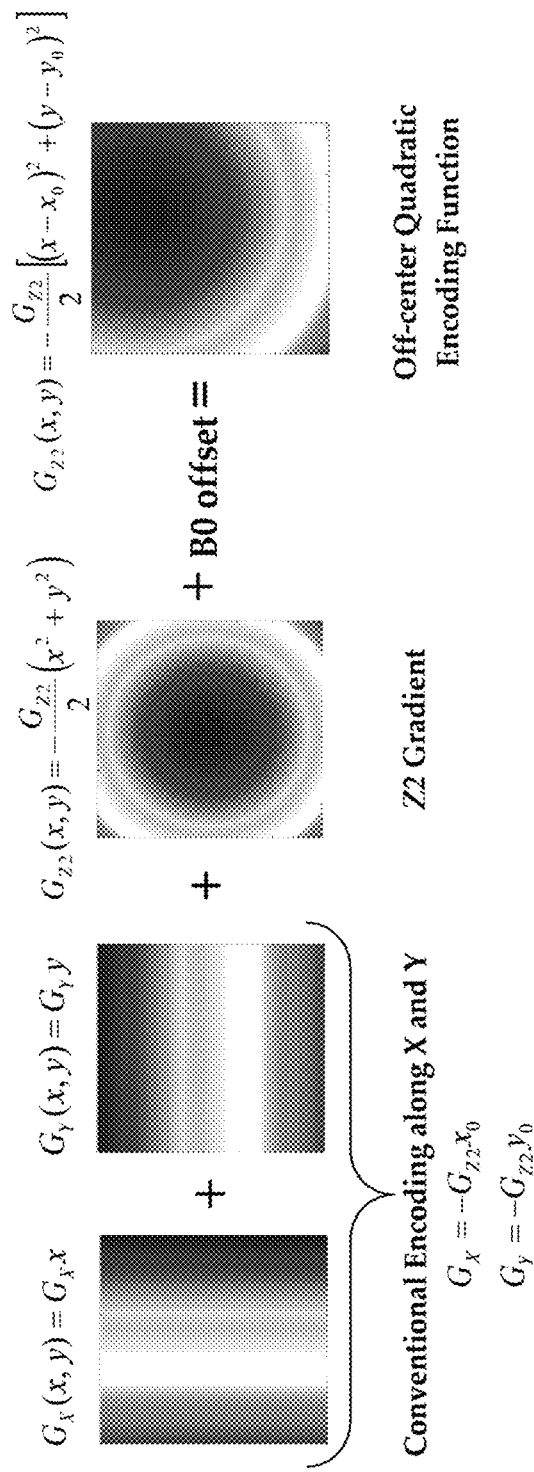
FIG. 1 shows according to an embodiment of the invention how off-center parabolic frequency distributions can be achieved by combining linear gradients with the Z2 field to complete the square.

To achieve radial frequency encoding we image in the axial plane and apply a Z2 dephase/rephase readout gradient. The radially-symmetric Z2 gradient is translated to the desired location in the FOV (center placement) using linear gradients and a B0 offset to complete the square, as shown in FIG. 1. Following slice selection, the X, Y, and Z2 gradients are used to dephase and rephase the spins, as in projection imaging. The signal equation for echo s(t) is $$s_{m,l}(t) = \int\int \rho(x,y) C_l(x,y) e^{-j2\pi G_{Z2} \frac{1}{2}((x-x_m)^2 + (y-y_m)^2)} dx\, dy$$
$$= A_{m,l,t}\rho$$

where $\rho(x,y)$ is the object, $C_l(x,y)$ is the receive coil sensitivity, $(x_m, y_m)$ specifies the CP, $G_{Z2}$ is the strength of the Z2 spherical harmonic in Hz/cm². Gradient strengths $G_X$ and $G_Y$ are chosen such that $G_X = -G_{Z2}x_m$ and $G_Y = -G_{Z2}y_m$ in Hz/cm. Echoes formed using different CPs during successive TRs comprise a dataset from which the image is reconstructed. In the discrete case, the integral kernel can be represented as a projection matrix $A_{m,n,t}$ at time point t for the $l^{th}$ coil and $m^{th}$ CP. The echoes and encoding functions from multiple CPs and coils are stacked to produce a single matrix equation:

$$s = A\rho$$

If radius $r_m$ is defined relative to each CP, the integral may be recast in polar coordinates:

$$s_{m,l}(t) = \int\int \rho(r_m, \phi) C_l(r_m, \phi) e^{-j2\pi G_{Z2} \frac{1}{2} r_m^2 t} r_m\, dr_m\, d\phi$$

With the choice of $$u = \frac{1}{2} r_m^2,$$

the inner integral assumes the form of the Fourier transform:

$$s_{m,l}(t) = \int\int \rho(u, \phi) C_l(u, \phi) e^{-j2\pi G_{Z2} u t} du\, d\phi$$

The inverse Fourier transform of the echo now yields $S_{m,l}(u)$, the projection of the object along the isocontours encircling the $m^{th}$ CP. The projection specifies the amount of energy in the coil profile-weighted object that is smeared around ring-like regions that decrease in width with increasing $r_m$ (as in FIG. 2a).

Because the encoding function is not in the form of a Fourier integral kernel, the data do not reside in k-space. Consequently, image reconstruction cannot be achieved using k-space density compensation and re-gridding approaches similar to those employed in non-Cartesian imaging with linear gradients. Because of this fact, image reconstruction is performed by directly solving the matrix equation $s = A\rho$ by one of two methods: a spatial domain algorithm based on the projections and a frequency domain algorithm based on the echoes.

When projections are obtained using the discrete Fourier transform, each point in the projection $S_{m,l}[u]$ corresponds to the sum of the object intensity at all voxels lying within a band that can be approximated as the $u^{th}$ isofrequency ring. If the point spread function of the quadratic gradient is approximated as a discrete band of frequencies, then for an $N_s$-point Fourier transform there exist $N_s$ isofrequency rings, where $N_s$ is the number of samples taken during readout.

The radius of the outermost ring specified by $r_{max} = \sqrt{BW/G_{Z2}}$ where BW is the sampling bandwidth. The sum over all voxels lying within a given ring is weighted by the $l^{th}$ surface coil profile at each point in that ring, $$S_{m,l}[u] = \sum_{x,y \in ring\, u} C_l[x,y] \rho[x,y]$$

When the object and coil profiles are represented in vector form, the set of all ring-domain equations may be vertically concatenated to form a single matrix equation accounting for all $N_s$ rings, M center placements, and L coils:

$$S[u] = [C \cdot W]\rho = E\rho$$

where · denotes the dot product and W is a sparse matrix whose $u^{th}$ row weights each voxel according to its contribution to the $u^{th}$ ring of a given CP. The simplest version of W contains ones for each voxel lying within the $u^{th}$ ring and zeroes elsewhere. For an N×N reconstruction, the encoding matrix E is of dimension [$N_s$×M×L, N×N]. Direct inversion of this matrix is challenging for practical matrix sizes, but the sparsity of the matrix can be exploited by a version of the conjugate gradient algorithm known as LSQR (17) that is available as a function call in MATLAB (Mathworks, Natick, Mass.). LSQR was selected for its ability to quickly solve sparse matrix equations with complex-valued and non-square matrix operators.

The spatial-domain solution amounts to back-projecting individual points in each projection onto the corresponding rings in the image. The difficulty with this approach is in accounting for the spatially-varying, complex point spread function (PSF) of each applied gradient shape. The PSF is not the same for all voxels lying between two frequency iscontours, particularly for the innermost rings where r approaches zero. The radial Gibbs ringing of the PSF due to convolution with the Fourier transform of the acquisition window boxcar only further complicates matters.

These obstacles can be surmounted by directly solving the integral equation $s = A\rho$ in the frequency (echo) domain using the Kaczmarz iterative projection algorithm—also known as the Algebraic Reconstruction Technique (ART)—a row-action method that has found application in computed tomography and cryo-electron microscopy (18). This algorithm compares each echo time point with the inner product of the appropriate row of the projection matrix, denoted $a_{m,n,t}$, with the $n^{th}$ iterate of the image estimator. The difference between these scalars weights the amount of basis function $a_{m,n,t}$ which is added to the estimator going into the next iteration:

$$\hat{\rho}_{n+1} = \hat{\rho}_n + \lambda \frac{s_{m,l,t} - \langle a_{m,l,t}, \hat{\rho}_n \rangle}{\|a_{m,l,t}\|^2} a^*_{m,l,t}$$

The algorithm typically converges in only a few iterations. The entire projection matrix—spanning all time points, coils, and center placements—is too large to fit in memory, precluding the use of LSQR as a MATLAB call. But with the Kaczmarz approach, only one data point is treated at a time, permitting individual basis functions to be recomputed on the fly or loaded from the hard drive in suitably sized chunks. While regularized versions of the Kaczmarz algorithm exist for dealing with inconsistent sets of equations (19), it has been shown that strongly underrelaxed Kaczmarz iteration (small values of $\lambda$) approach the minimum-norm least-squares solution for $\hat{\rho}$ (20), equivalent to the pseudo-inverse. We chose to use underrelaxation to minimize the effects both of random noise in s and of systematic error in the gradient shapes described by A, at the expense of increasing the reconstruction time.

It should be noted that the true shape of each "ring" can be obtained by Fourier transforming each $N_S \times N^2$ block of the encoding matrix along the temporal (column) direction. These image-domain matrices can be assembled into an equation for the unknown image using the projection data (i.e., FT of the echoes). This version of the encoding matrix can be sparsified by truncating all values falling below a certain threshold, leaving only the point spread function in the vicinity of each ring. With the sparse encoding matrix able to be stored in memory all at once, LSQR would present an attractive alternative to Kaczmarz for reconstructing the image.

Methods

Simulations were used to address four items. First, LSQR/image-domain reconstructions were used to quickly explore a variety of center placement schemes to find one that provides efficient O-Space encoding. Second, once a CP scheme had been chosen, Kaczmarz/frequency-domain reconstructions were used to compare O-Space and SENSE reconstructions over a wide range of acceleration factors. Third, Kaczmarz reconstructions were used to investigate the degradation of O-Space and SENSE reconstructions in the presence of increasing amounts of noise. Fourth, Kaczmarz simulations were used to investigate the effects of increased ring density on the resolution of O-Space images.

Two phantoms were used for each simulation: a low-noise axial brain image (FIG. 3a) obtained by averaging multiple conventional acquisitions; and a numerical phantom (FIG. 3b) designed to illustrate the spatially-varying resolution and contrast properties of O-Space encoding gradients. The numerical phantom incorporates small features in the center of the FOV and sharp edges in the X and Y directions. Lesion-like features at four different contrast levels are also included.

Simulated 128×128 reconstructions were performed to determine a highly-efficient center placement scheme within the FOV for datasets consisting of 32 and 16 echoes (21). By analogy to Cartesian parallel imaging, this corresponds to 4-fold and 8-fold undersampling, respectively. A variety of coil geometries were also considered, ranging from 8 to 32 circumferentially-distributed loop coils, for whose B-fields an exact analytical expression exists in the magnetostatic limit (22). Reconstructions were performed in the image domain using the projections of the sample about each CP (1D FT of each echo). For simplicity and computational efficiency, a ring approximation to the true PSF was used in which each voxel lying between frequency isocontours was averaged evenly over all voxels enclosed between the two contours. This results in a highly sparse image-domain encoding matrix that is less memory-intensive than the frequency-domain encoding matrix. CP schemes were evaluated based on the minimum mean squared error using the LSQR reconstruction as compared with the phantom.

Once a highly-efficient CP scheme was chosen, the Kaczmarz algorithm was used to perform more accurate reconstructions by directly solving the frequency-domain matrix representation of the signal equation for both simulated and acquired echoes. O-Space reconstructions were compared to SENSE reconstructions for R=4, R=8, and R=16; for the R=4 case, the reconstructions were then compared in the presence of varying amounts of noise. Noise amplification in the SENSE reconstructions was mitigated using Tikhonov regularization via the truncated SVD of the aliasing matrix (23).

Uncorrelated Gaussian noise was added to the phantom prior to multiplication by each of the 8 coil profiles used in the simulations. The noise standard deviation was scaled relative to the mean intensity in the phantom. Noise correlations between the coil channels were neglected for the purposes of this study and will be treated in future work. It is expected that these correlations will similarly impact both conventional Cartesian SENSE reconstruction and the proposed O-Space approach.

To explore the effects of ring density on resolution, the gradient strength and the number of readout points ($N_s$) were sequentially increased while extra channel noise was injected into the echoes to model the increased sampling BW.

For proof of concept, experimental data were collected on a 4.7T Bruker animal magnet (Billerica, Mass.) operating at 4T (total bore diameter=310 mm) with a Bruker Avance console. The system is equipped with dynamic shimming updating (DSU) on all first and second-order gradients that can be triggered from within a pulse sequence (24).

To avoid radial aliasing in O-Space, the sampling bandwidth and Z2 gradient strength $G_{Z2}$ were chosen so that the outermost frequency ring did not fall within the object for a particular CP:

$$BW \geq r_{max}^2 G_{Z2}$$

In practice, even with the Z2 coil set to full strength over a 50 ms echo, most of the sampled rings lay outside the phantom, leading to suboptimal encoding, specific to this gradient set but not to the approach.

Results

Figure 2:
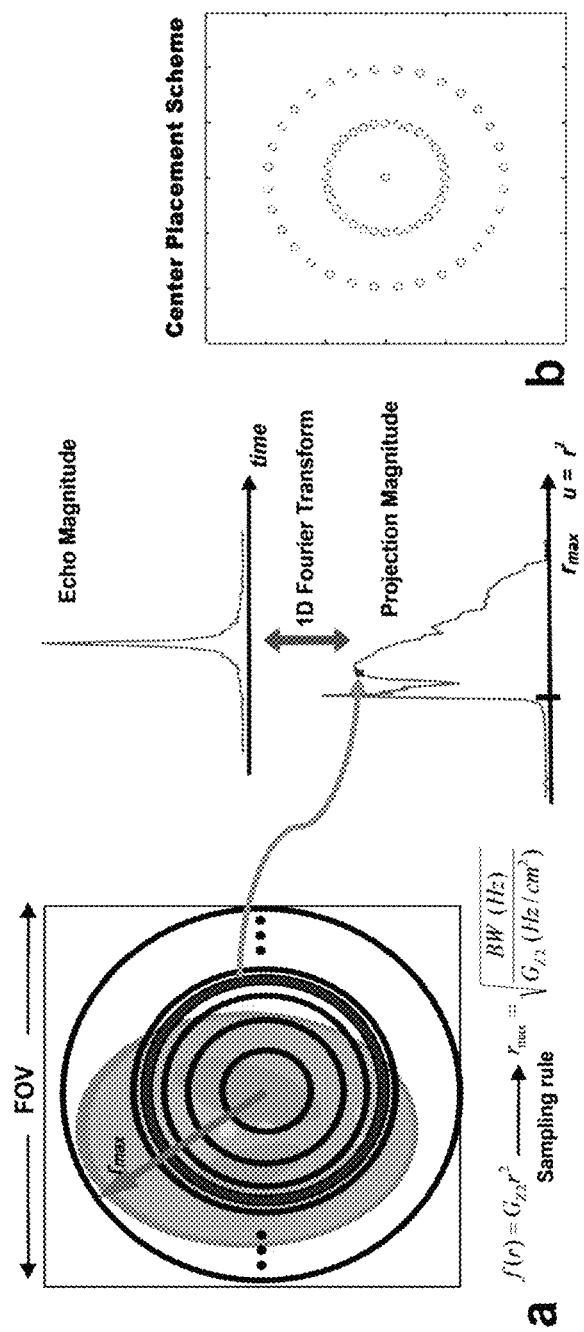
FIG. 2 shows according to an embodiment of the invention: (a) Fourier transforming O-Space echoes yields a projection of the object along a set of concentric rings. (b) The selected 65 center placements (CPs) correspond to successive echoes in an O-Space acquisition. Datasets with 33 CPs and 17 CPs are obtained by skipping inner and outer-ring CPs as appropriate.
Figure 3:
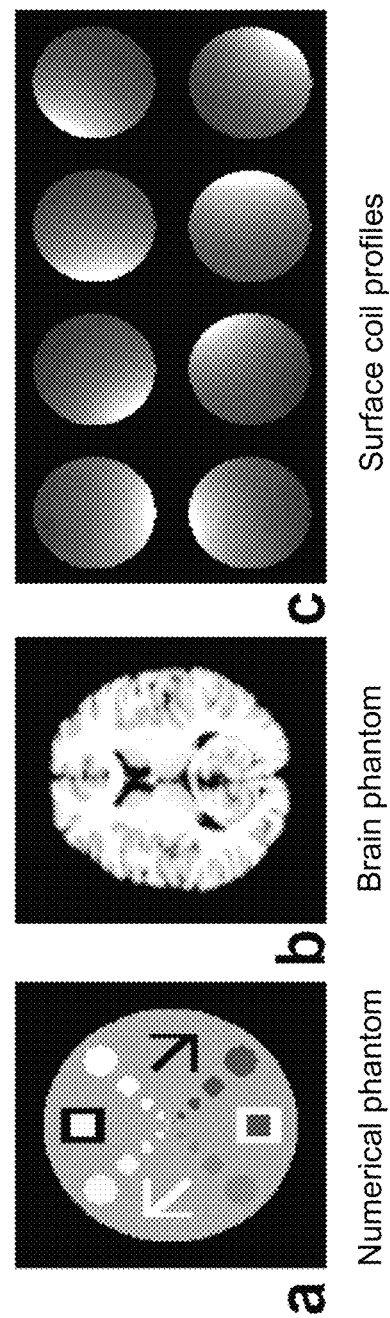
FIG. 3 shows according to an embodiment of the invention: (a) Numerical phantom, (b) Brain phantom, (c) Surface coil profiles used in the simulations.
Figure 4:
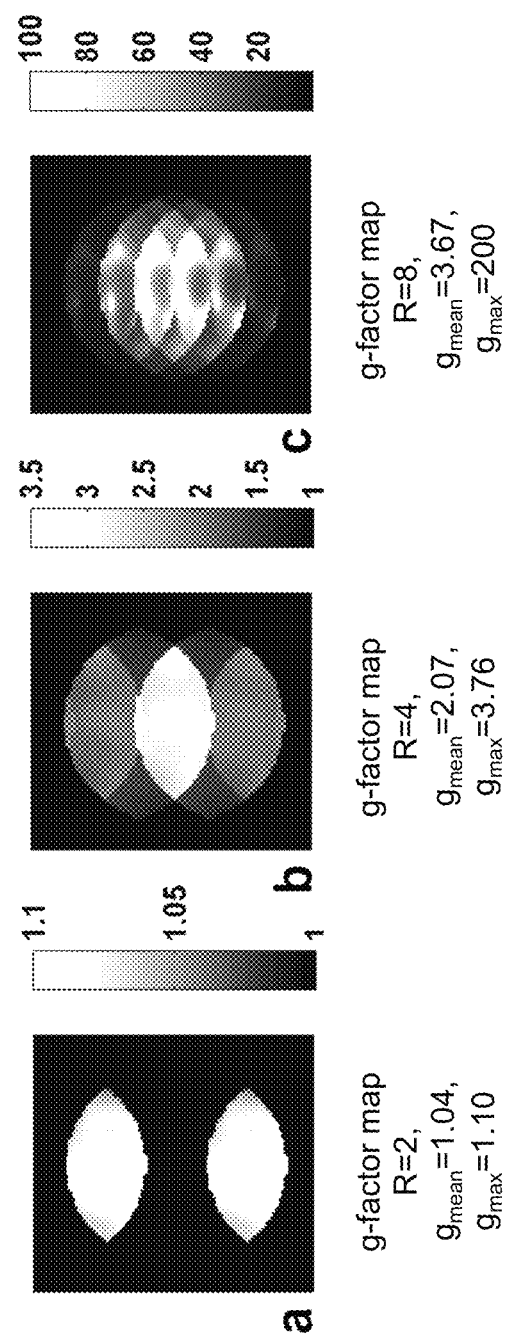
FIG. 4 shows according to an embodiment of the invention maps of the g-factor for profiles acquired using an effective 8-element receiver coil array. (a) R=2, $g_{mean}$=1.04, $g_{max}$=1.10. (b) R=4, $g_{mean}$=2.07, $g_{max}$=3.76. (c) R=8, $g_{mean}$=3.67, $g_{max}$=200.

The center placement scheme yielding the minimum mean squared error reconstruction in LSQR simulations is displayed in FIG. 2b. The phantoms and coil profiles used in all of the simulations are shown in FIG. 3. For this coil array, the g-factor was computed (2) in a 3 cm FOV for each acceleration factor considered in this study as well as for the case of R=2 (FIG. 4). Adjusting for the FOV, the g-factor maps were commensurate with those typically obtained from 8-channel arrays on human systems.

Figure 5:
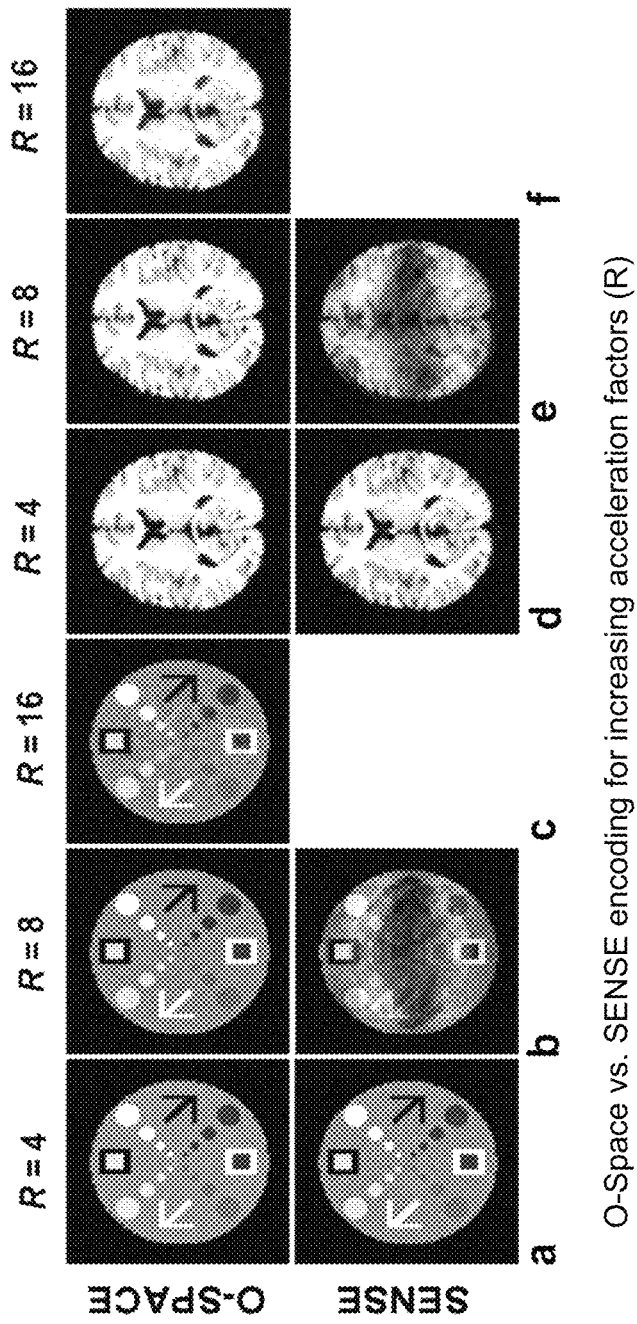
FIG. 5 shows according to an embodiment of the invention an advantage of O-Space over SENSE encoding grows dramatically with acceleration factor (R) in an 8-coil array with moderate noise (5% of mean phantom intensity). As R increases from 4 to 8, 1D SENSE reconstructions rapidly deteriorate. By contrast, O-Space performance degrades gradually, displaying only moderate noise amplification and blurring of small features. O-Space reconstructions show promise even when R exceeds the number of coils, a scenario not possible with SENSE.

In the R=4 Kaczmarz reconstructions with 5% noise, O-Space images displayed comparable resolution and slightly lower noise levels as compared with SENSE images (FIG. 5). At R=8, however, the SENSE reconstruction with 8 coils becomes extremely ill-conditioned and either entirely overwhelmed by noise (as in the original voxel-wise pseudo-inverse SENSE method) or plagued by severe residual artifacts, depending on the regularization parameter selected. By contrast, the O-Space reconstruction at R=8 shows a comparatively mild increase in noise and loss of resolution. At R=16, an acceleration factor for which 1D SENSE reconstructions are impossible, O-Space images show pronounced degradation, but still retain impressive resolution and noise levels for images based on only 8 echoes. The compatibility of O-Space imaging with extremely high acceleration factors suggests uses in functional brain imaging, cardiac imaging, and other applications in which spatial resolution is traded for temporal resolution, but artifact levels must remain low.

Figure 6:
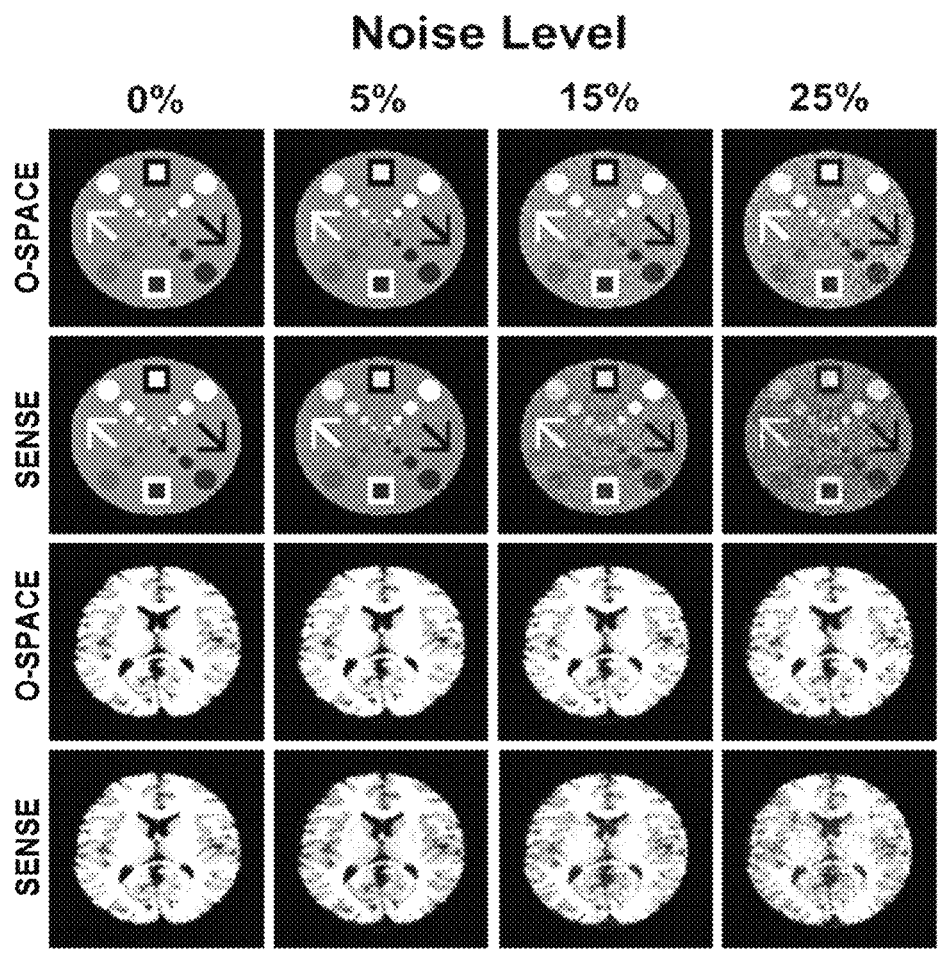
FIG. 6 shows according to an embodiment of the invention noise levels for 8-coil O-Space and SENSE reconstructions at R=4. As the noise standard deviation grows from 0% to 25% of the mean phantom intensity. While SENSE is highly sensitive to noise and requires regularization to prevent noise amplification from dominating the image, O-Space reconstructions degrade gracefully even when the data are highly noisy. In addition, O-Space noise is distributed more evenly throughout the FOV, while SENSE noise is concentrated in areas of high g-factor.

When the acceleration factor is held constant at R=4 and the noise level is varied (FIG. 6), the noise in O-Space reconstructions is both lower and more spatially uniform than the noise in SENSE reconstructions. In SENSE images, the fact that each point in the reduced FOV unwraps onto R-1 points in the full FOV causes severe noise amplification in the voxels in the reduced FOV that have the most overlapping layers of signal from the phantom. In O-Space imaging, by contrast, each voxel is smeared out along rings according to the spatially-varying PSF of each center placement, preventing noise from concentrating in any one region of the image.

Figure 7:
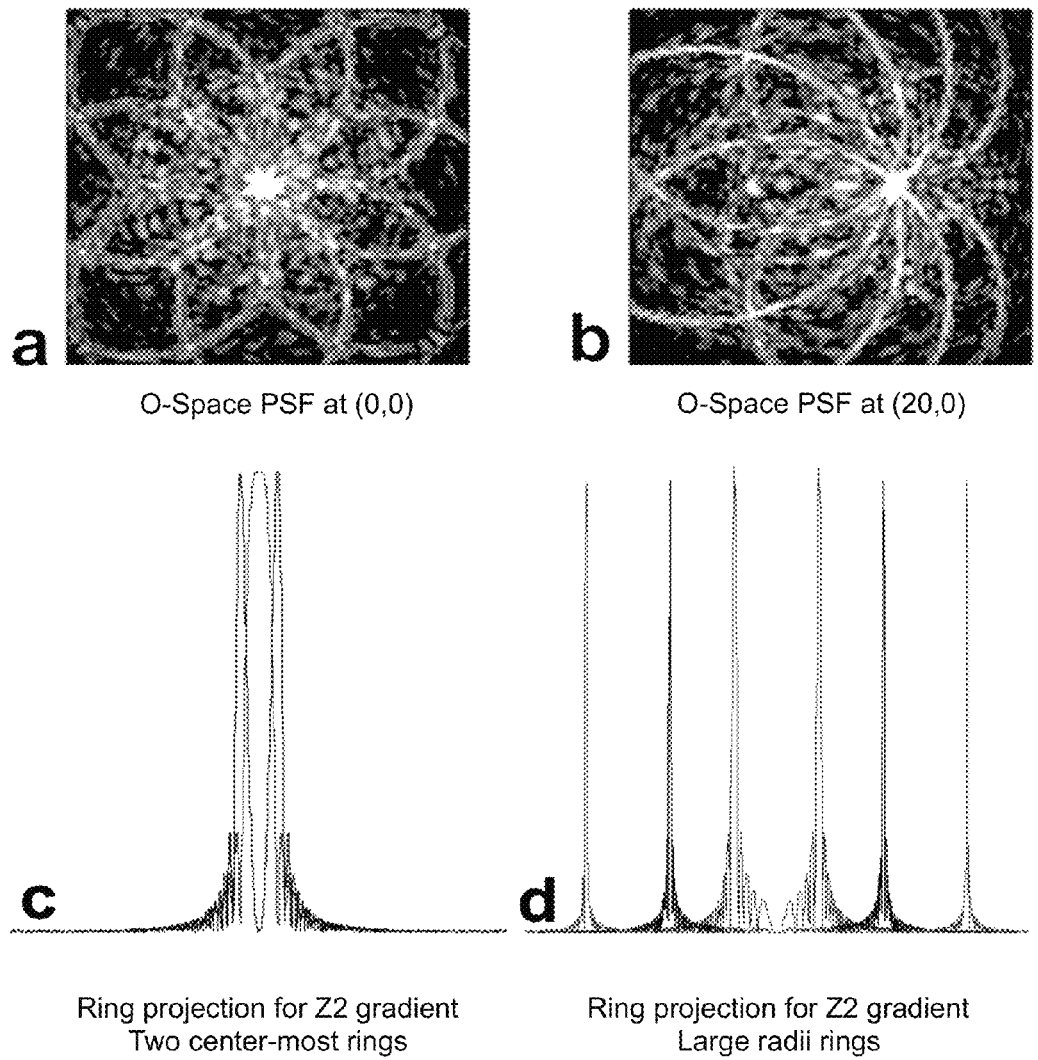
FIG. 7 shows according to an embodiment of the invention spatially-varying O-Space PSF of the 16-CP scheme used in simulations for a point source of unit intensity located at (x,y)=(0,0) (a) and (x,y)=(20,0) (b) within a 128×128 FOV. The scale is adjusted to bring out low-level features. Horizontal profiles through the ring projections for the Z2 gradient alone illustrate the poor resolution of the two center-most rings (c) in contrast to the very fine resolution of rings at larger radii in the FOV (d).

By performing Kaczmarz reconstructions of point sources at different locations in the FOV, we calculated the PSF of our chosen CP scheme. To isolate the effects of the gradient encoding alone, a single coil with uniform sensitivity was used. As expected, for each CP the source blurs along a ring that has the CP at its origin (FIGS. 7a, 7b). The source is localized to the point where all 16 of the rings overlap, with additional localization provided when a surface coil array is used. To illustrate the encoding provided by the Z2 gradient alone, the encoding matrix for the Z2 gradient was Fourier Transformed along the temporal dimension (row-wise), yielding the ring-like shapes that correspond to each point in an O-Space projection. Magnitude plots of a horizontal profile through the center of the FOV (FIGS. 7c, 7d) illustrate the radial variation in resolution and the effects of echo truncation. Since the derivative of the Z2 field shape is zero at the center of the FOV, all encoding in this region comes from the application of the X and Y gradients to shift the rings off-center. Truncation of an echo with duration $\tau$ results in convolution of the rings by $\text{sinc}(u/\tau)$ in u-space, corresponding to $\text{sinc}(r^2/\tau)$ in the image domain. This leads to widening of the sidelobes as r approaches zero.

Figure 8:
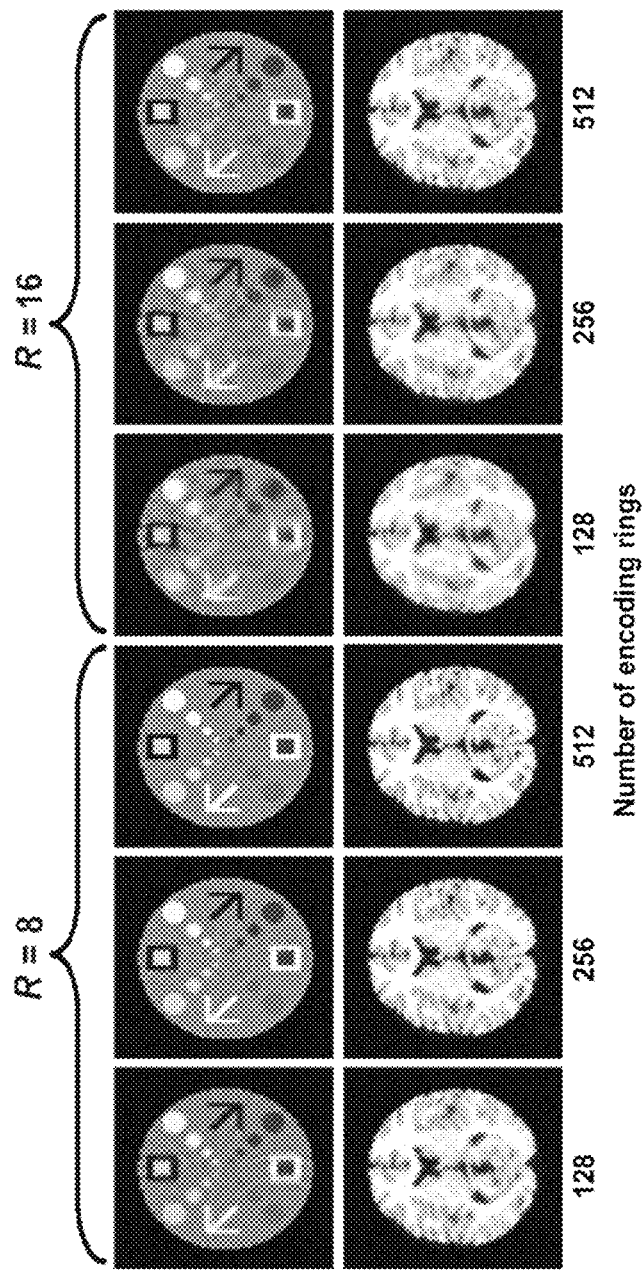
FIG. 8 shows according to an embodiment of the invention time-equivalent R=8 (16 CP) O-Space 128×128 phantom reconstructions based on 128 rings, 256 rings, and 512 rings per echo, along with corresponding brain simulations, demonstrate the resolution improvements created by dense ring spacing within the object. For each case, highly-accelerated R=16 (8 CP) reconstructions are also shown for the phantom and brain. Uncorrelated noise with standard deviation equal to 5% of the mean phantom intensity was added during echo simulation. The noise is then scaled by $\sqrt{2}$ and $\sqrt{4}$ in the 256 and 512-point reconstructions, respectively, to reflect the increased sampling BW.

As expected, increased ring density within the phantom contributes to substantial improvements in resolution. The 128-ring O-Space reconstructions show extensive blurring and background non-uniformity at both R=8 (FIGS. 8a-c) and R=16 (FIGS. 8d-f), suggesting that 128 rings are inadequate for highly accelerated acquisitions. But these artifacts diminish in the 256-ring and 512-ring cases for both R=8 and R=16. This shows that O-Space imaging benefits from using increased gradient strength and sampling BW during readout to boost ring density. This stands in contrast to Cartesian acquisitions, where oversampling provides no reduction in aliasing artifacts along the undersampled direction(s). Although there is no simple rule for "Nyquist sampling" of an O-Space echo, the gradient strength or dwell time may be increased up to point where the outermost ring is drawn inside the phantom, causing the outermost spins to alias back onto a low frequency ring. This definition of Nyquist sampling depends on the location of the CP within the object, suggesting that the ring density may be allowed to vary between echoes for optimal encoding efficiency. The achievable ring density in the sample is limited only by the diminishing SNR provided by very thin rings and safety regulations on gradient switching rates. In principle, surface coils could be used to "unwrap" radial aliasing caused by undersampling of the echo, but it's not clear how such undersampling would improve resolution or acquisition time.

Figure 9:
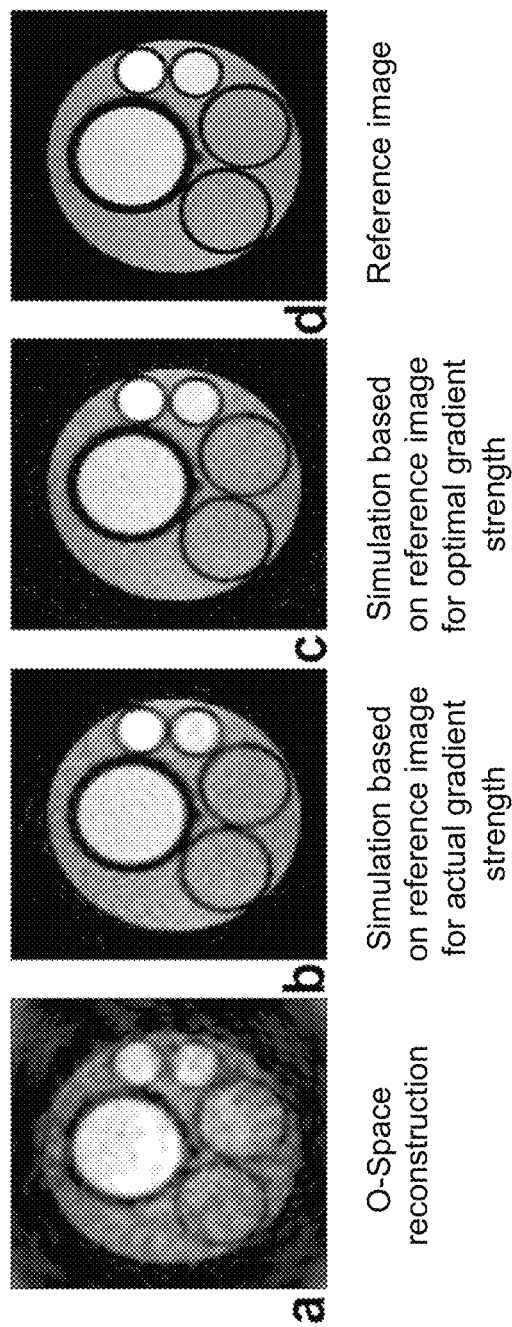
FIG. 9 shows according to an embodiment of the invention O-Space Reconstruction (a) using acquired data from the volume coil with 65 CPs along with a Cartesian spin echo reference image acquired at the same TE of 210 ms (d) (128×128 voxels, FOV=3 cm). O-Space simulations based on the reference image are shown for the actual (b) and optimal (c) gradient strength.

Volume-coil datasets acquired with the dynamic shimming Z2 gradient consisted of 64 CPs distributed around the center of the FOV, a $65^{th}$ echo using just the Z2 gradient, and an FID with no applied gradients to monitor scanner frequency drift. The reconstruction in FIG. 9a from these data shows two principle types of artifacts: those arising from systematic errors in the gradient calibrations; and those caused by the limited available Z2 gradient strength. Simulated comparisons of reconstructions using the actual acquisition parameters (FIG. 9b) with an acquisition using ideal, "Nyquist-sampled" readouts (FIG. 9c) show that most of the artifacts in a single-coil R=2 acquisition can be eliminated if an adequately strong Z2 gradient is used. But the volume coil data prove that O-Space imaging can be performed even under non-ideal conditions with imperfect knowledge of the gradient fields and inadequate Z2 gradient strengths.

REFERENCES

[1] Sodickson D K, Maiming W J. Simultaneous acquisition of spatial harmonics (SMASH): fast imaging with radiofrequency coil arrays. Magn. Reson. Med. 1997; 38:591-603.

[2] Pruessmann K P, Weiger M, Scheidegger M B, Boesiger P. SENSE: sensitivity encoding for fast MRI. 1999; 42:952-62.

[3] Griswold M A et al. Generalized autocalibrating partially parallel acquisitions (GRAPPA). Magn. Reson. Med. 2002; 47:1202-10.

[4] Breuer F A, SA Kannengiesser, Blaimer M, Seiberlich N, Jakob P M, Griswold M A. General formulation for quantitative g-factor calculation in GRAPPA reconstructions. Magn. Reson. Med. 2009; 62:739-746.

[5] Ohliger M A, Sodickson D K. An introduction to coil array design for parallel MRI. NMR in Biomed. 2006; 19:300-315.

[6] Pruessmann K P, Weiger M, Bornert P, Boesiger P. Advances in sensitivity encoding with arbitrary k-space trajectories. Magn. Reson. Med. 2001; 46:638-51.

[7] Pruessmann K. Encoding and reconstruction in parallel MRI. 2006; 19:288-299.

[8] Wiggins G C, Triantafyllou C, Potthast A, Reykowski A, Nittka M, Wald L L. 32-channel 3 Tesla receive-only phased array head coil with soccer-ball element geometry. Magn. Reson. Med. 2006; 56:216-223.

[9] Wiggins G C Polimeni J R, Potthast A, Schmitt M, Alagappan V, Wald LL. 96-channel receive-only head coil for 3 Tesla: Design optimization and evaluation. Magn. Reson. Med. 2009; 62:754-762.

[10] King S B, Varosi S M, Duensing G R. Eigenmode analysis for understanding phased array coils and their limits. Con. Magn. Reson. B 2006; 29B(1):42-49.

[11] Wiesinger F, Boesinger P, Pruessmann K P. Electrodynamics and ultimate SNR in parallel MR imaging. Magn. Reson. Med. 2004; 52:376-390.

[12] Vaughan J T et al. Whole-body imaging at 7T: Preliminary results. Magn. Reson. Med. 2009; 61:244-248.

[13] Hennig J et al. Parallel imaging in non-bijective, curilinear magnetic field gradients: a concept study. Magn. Reson. Mater. Phys. 2008; 21:5-14.

[14] Welz A M et al. Initial realization of a multi-channel, nonlinear PatLoc gradient coil. In Proceedings of the ISMRM 16th Annual Meeting, Toronto, ON, 2008, p. 1163.

[15] Stockmann J P, Ciris P A, Constable R T. Efficient "O-Space" parallel imaging using non-linear encoding fields with no phase encoding. In Proceedings of the ISMRM 17th Annual Meeting, Honolulu, Hi., USA, 2009, p. 761.
[16] Romeo F, Hoult D I. Magnetic field mapping: Analysis and correcting coil design. Magn. Reson. Med. 1984; 1:44-65.
[17] Paige C C, Saunders M A. LSQR: An algorithm for sparse linear equations and sparse least squares. ACM Trans. Math. Software 1982; 8(1):43-71.
[18] Herman G T, Lent A. Iterative reconstruction algorithms. Comput. Biol. Med. 1976; 6:273-294.
[19] Eggermont PP B, Herman G T, Lent A. Iterative algorithm for large partitioned linear systems, with applications to image reconstruction. Lin. Alg. Applications 1981; 40:37-67.
[20] Censor Y, Eggermont P P B, Gordon D. Strong underrelaxation in Kaczmarz's method for inconsistent systems. Numer. Math. 1983; 41:83-92.
[21] Ciris P A. O-space imaging: Tailoring encoding gradients to coil profiles for highly accelerated imaging. In Proceedings of the ISMRM 17th Annual Meeting, Honolulu, Hi., USA, 2009, p. 4556.
[22] Smythe W R, Static and Dynamic Electricity., 3rd ed. New York: McGraw-Hill; 1968.
[23] Lin F, Kwong K K, Belliveau J W, Wald L L. Parallel imaging reconstruction using automatic regularization. Magn. Reson. Med. 2004; 51:559-567.
[24] Koch K M, In vivo static field perturbations in magnetic resonance. Thesis. Yale University; 2006.
[25] de Graaf R A, In vivo NMR spectroscopy: Principles and techniques. Chichester, UK: John Wiley & Sons; 2008.

The invention claimed is:

1. A magnetic resonance imaging method of performing parallel O-Space imaging comprising:
performing, with a magnetic resonance imaging magnet system and an encircling circumferential array of RF imaging coils, an excitation of nuclear spins in an object;
applying spatially-varying second-order nonlinear gradient encoding magnetic fields, which encodes the excited nuclear spins as a series of O-space imaging projections, with these encoded O-space imaging projections replacing conventional phase encoding;
whereby each O-space imaging projection, is a projection onto a set of frequency isocontour rings that are concentric about different center placements (CPs) in a field of view (FOV) of the object; wherein the different center placements (CPs) correspond to successive echoes in an O-space imaging projection; and
wherein these O-space imaging projections are a combination of Z2 spherical harmonic gradients along with X and Y linear gradients that functionally off set each O-space projection in an imaging plane, with the center of the Z2 spherical harmonic function being shifted off-center using the X and Y gradients for each echo encoded;
optimizing the O-space imaging protections by using linear combinations of multiple spherical harmonics in order to form gradient shapes tailored so the gradient spatial encoding applied is complementary to the spatial encoding provided by the encircling circumferential array of RF imaging coils;
measuring in parallel the received RF echo signals that are induced by the nuclear spins in the presence of the spatially-varying second-order nonlinear gradient encoding magnetic fields, of the Z2 spherical harmonics in the O-space imaging projections, by the encircling circumferential array of RF receiver coils; and
reconstructing a magnetic resonance image, with the magnetic resonance imaging magnet system that is then provided and/or displayed.

2. The method of claim 1 wherein the second-order nonlinear gradient encoding magnetic fields have a radially-symmetric gradient shape.

3. The method of claim 1 wherein the second-order nonlinear gradient encoding magnetic fields vary both as first-order and second-order Z2 spherical harmonics with position, creating radially-symmetric magnetic encoding fields that are complementary to a spatial variation of the circumferentially encircling array of RF receiver coils.

4. The method as in claim 1, whereby an accelerated parallel imaging, producing diagnostically usable results even when the acceleration factor R exceeds the number of imaging coils in the circumferential array of RF coils, is obtained.

5. The method of claim 1, wherein the location of the set of isofrequency contour rings is changed by varying gradient amplitudes.

6. The method of claim 1, wherein the center placements (CP's) of the set of isofrequency contour rings in space, is/are moved by a combination of linear and nonlinear gradients.

7. The method of claim 1, wherein the center placements (CP's) are selected such that regions with a flat gradient profile in an initial center placement (CP) acquisition will have a steep gradient profile in either a separate or different center placement (CP) acquisition.

8. The method of claim 1, wherein combinations of X, Y, and Z2 gradients perform both gradient dephasing and gradient rephasing.

9. The method of claim 1, wherein combinations of X, Y, and Z2 gradients are used in echo imaging sequences including: gradient echo, spin echo and stimulated echo imaging sequences.

10. The method as in claim 1, wherein the two-dimensional nature of the Z2 gradient simultaneously produces frequency encoding in two dimensions during readout.

11. The method of claim 1, wherein the application of combinations of X, Y, and Z2 gradients permits the performing of projection imaging in any plane including: axial, sagittal, coronal, and oblique planes.

* * * * *